United States Patent
Quick et al.

(10) Patent No.: US 9,601,641 B1
(45) Date of Patent: Mar. 21, 2017

(54) ULTRA-HIGH PRESSURE DOPING OF MATERIALS

(71) Applicant: AppliCote LLC., Lake Mary, FL (US)

(72) Inventors: Nathaniel R Quick, Lake Mary, FL (US); Michael C Murray, Eustis, FL (US)

(73) Assignee: AppliCote Associates, LLC, Lake Mary, FL (US)

( * ) Notice: Subject to any disclaimer, the term of this patent is extended or adjusted under 35 U.S.C. 154(b) by 0 days.

(21) Appl. No.: 14/563,880

(22) Filed: Dec. 8, 2014

Related U.S. Application Data (60) Provisional application No. 61/948,006, filed on Mar. 4, 2014, provisional application No. 61/936,078, filed on Feb. 5, 2014, provisional application No. 61/914,364, filed on Dec. 10, 2013.

(51) Int. Cl.
| | | |
|---|---|---|
| *H01L 21/268* | (2006.01) | |
| *H01L 31/0288* | (2006.01) | |
| *H01L 31/18* | (2006.01) | |
| *H01L 21/24* | (2006.01) | |

(52) U.S. Cl.
CPC ...... *H01L 31/0288* (2013.01); *H01L 31/1812* (2013.01); *H01L 31/1856* (2013.01); *H01L 21/242* (2013.01); *H01L 21/268* (2013.01)

(58) Field of Classification Search
CPC .............. H01L 21/268; H01L 21/0242; H01L 21/02689; H01L 21/02529
See application file for complete search history.

(56) References Cited

U.S. PATENT DOCUMENTS

| | | |
|---|---|---|
| 3,214,315 A | 10/1965 | Hildebrand |
| 3,396,401 A | 8/1968 | Nonomura |
| 3,419,321 A | 12/1968 | Barber et al. |
| 3,605,469 A | 9/1971 | Guar-alto |
| 3,788,120 A | 1/1974 | Takeo et al. |
| 3,854,123 A | 12/1974 | Banach |
| 3,865,564 A | 2/1975 | Jaeger et al. |
| 3,874,240 A | 4/1975 | Rembaum |
| 3,943,324 A | 3/1976 | Haggerty |
| 3,944,640 A | 3/1976 | Haggerty et al. |
| 3,965,328 A | 6/1976 | Locke |

(Continued)

FOREIGN PATENT DOCUMENTS

| | | |
|---|---|---|
| GB | WO 03013757 | 2/2000 |
| JP | 358095830 A | 6/1983 |
| JP | 405024975 A | 2/1993 |

OTHER PUBLICATIONS

Nathaniel R. Quick, Laser Conversion of Ceramic Materials to Electroconductors, International Conference on Electronic Materials-1990, Materials Research Society, Newark, New Jersey, Sep. 17-19, 1990.

(Continued)

*Primary Examiner* — John C Ingham
(74) *Attorney, Agent, or Firm* — Frijouf, Rust & Pyle P.A.

(57) ABSTRACT

A method and apparatus is disclosed for doping a semiconductor substrate with a dopant concentration greater than $10^{20}$ atoms per cubic centimeter. The method is suitable for producing an improved doped wide bandgap wafer for power electronic devices, photo conductive semiconductor switch, or a semiconductor catalyst.

21 Claims, 5 Drawing Sheets

(56) References Cited

U.S. PATENT DOCUMENTS

| | | |
|---|---|---|
| 3,981,705 A | 9/1976 | Jaeger et al. |
| 4,043,170 A | 8/1977 | Erodi et al. |
| 4,135,902 A | 1/1979 | Oehrle |
| 4,142,088 A | 2/1979 | Hirsch |
| 4,159,414 A | 6/1979 | Suh et al. |
| 4,215,283 A | 7/1980 | Grey et al. |
| 4,309,224 A | 1/1982 | Shibata |
| 4,339,285 A | 7/1982 | Pankove |
| 4,372,989 A | 2/1983 | Menzel |
| 4,383,843 A | 5/1983 | Iyengar |
| 4,387,276 A | 6/1983 | Plewes et al. |
| 4,401,479 A | 8/1983 | Quick |
| 4,480,014 A | 10/1984 | Milligan et al. |
| 4,496,607 A | 1/1985 | Mathias |
| 4,529,566 A | 7/1985 | Quick |
| 4,534,310 A | 8/1985 | Quick |
| 4,539,251 A | 9/1985 | Sugisawa et al. |
| 4,547,650 A | 10/1985 | Arditty et al. |
| 4,565,712 A | 1/1986 | Noguchi et al. |
| 4,620,264 A | 10/1986 | Ushifusa et al. |
| 4,624,934 A | 11/1986 | Kokubu et al. |
| 4,663,826 A | 5/1987 | Baeuerle |
| 4,691,091 A | 9/1987 | Lyons et al. |
| 4,710,253 A | 12/1987 | Soszek |
| 4,761,339 A | 8/1988 | Komatsu et al. |
| 4,791,239 A | 12/1988 | Shirahata et al. |
| 4,840,853 A | 6/1989 | Lio et al. |
| 4,847,138 A | 7/1989 | Boylan et al. |
| 4,860,442 A | 8/1989 | Ainsworth et al. |
| 4,872,923 A | 10/1989 | Borodin |
| 4,880,770 A | 11/1989 | Mir et al. |
| 4,901,550 A | 2/1990 | Koide |
| 4,912,087 A | 3/1990 | Aslam et al. |
| 4,924,033 A | 5/1990 | Iyogi et al. |
| 4,950,558 A | 8/1990 | Sarin |
| 4,962,085 A | 10/1990 | deBarbadillo, II et al. |
| 4,988,564 A | 1/1991 | D'Angelo et al. |
| 5,015,618 A | 5/1991 | Levinson |
| 5,055,967 A | 10/1991 | Sukonnik et al. |
| 5,070,591 A | 12/1991 | Quick et al. |
| 5,127,364 A | 7/1992 | Savkar et al. |
| 5,145,741 A | 9/1992 | Quick |
| 5,149,681 A | 9/1992 | Ohkawa et al. |
| 5,180,440 A | 1/1993 | Siegel et al. |
| 5,184,662 A | 2/1993 | Quick et al. |
| 5,336,360 A | 8/1994 | Nordine |
| 5,391,841 A | 2/1995 | Quick |
| 5,405,481 A | 4/1995 | Licoppe et al. |
| 5,459,098 A | 10/1995 | Maya |
| 5,493,096 A | 2/1996 | Koh |
| 5,549,971 A | 8/1996 | Nordine |
| 5,629,532 A | 5/1997 | Myrick |
| 5,680,200 A | 10/1997 | Sugaya et al. |
| 5,695,828 A | 12/1997 | Ghosh et al. |
| 5,733,609 A | 3/1998 | Wang |
| 5,754,299 A | 5/1998 | Sugaya et al. |
| 5,793,042 A | 8/1998 | Quick |
| 5,823,039 A | 10/1998 | Umeda et al. |
| 5,837,607 A | 11/1998 | Quick |
| 5,847,418 A | 12/1998 | Nakamura et al. |
| 5,889,234 A | 3/1999 | Ghosh et al. |
| 5,906,708 A | 5/1999 | Robinson et al. |
| 5,981,877 A | 11/1999 | Sakata et al. |
| 6,025,609 A | 2/2000 | Quick |
| 6,046,091 A | 4/2000 | Quick et al. |
| 6,054,375 A | 4/2000 | Quick |
| 6,064,081 A | 5/2000 | Robinson et al. |
| 6,079,089 A | 6/2000 | Quick et al. |
| 6,096,212 A | 8/2000 | Quick et al. |
| 6,112,395 A | 9/2000 | Quick et al. |
| 6,180,909 B1 | 1/2001 | Quick et al. |
| 6,200,523 B1 | 3/2001 | Quick et al. |
| 6,203,861 B1 | 3/2001 | Kar et al. |
| 6,215,648 B1 | 4/2001 | Quick et al. |
| 6,221,154 B1 | 4/2001 | Lee et al. |
| 6,248,192 B1 | 6/2001 | Quick et al. |
| 6,252,197 B1 | 6/2001 | Hoekstra et al. |
| 6,255,671 B1 | 7/2001 | Bojarczuk et al. |
| 6,271,576 B1 | 8/2001 | Quick |
| 6,274,234 B1 | 8/2001 | Dujardin et al. |
| 6,291,806 B1 | 9/2001 | Quick et al. |
| 6,292,349 B1 | 9/2001 | Quick et al. |
| 6,313,015 B1 | 11/2001 | Lee et al. |
| 6,329,625 B1 | 12/2001 | Quick et al. |
| 6,334,939 B1 | 1/2002 | Zhou et al. |
| 6,381,826 B1 | 5/2002 | Quick et al. |
| 6,407,443 B2 | 6/2002 | Chen et al. |
| 6,435,861 B1 | 8/2002 | Quick et al. |
| 6,437,967 B1 | 8/2002 | Quick et al. |
| 6,497,029 B1 | 12/2002 | Quick et al. |
| 6,526,327 B2 | 2/2003 | Kar et al. |
| 6,621,448 B1 | 9/2003 | Lasky et al. |
| 6,652,615 B2 | 11/2003 | Quick et al. |
| 6,670,693 B1 | 12/2003 | Quick |
| 6,732,562 B2 | 5/2004 | Quick et al. |
| 6,930,009 B1 | 8/2005 | Quick |
| 6,939,748 B1 | 9/2005 | Quick |
| 7,013,695 B2 | 3/2006 | Quick et al. |
| 7,237,422 B2 | 7/2007 | Quick et al. |
| 7,268,063 B1 | 9/2007 | Quick et al. |
| 7,419,887 B1 | 9/2008 | Quick et al. |
| 7,603,883 B2 | 10/2009 | Quick et al. |
| 7,618,880 B1 | 11/2009 | Quick |
| 7,630,147 B1 | 12/2009 | Kar et al. |
| 7,687,016 B1* | 3/2010 | DiCarlo ............... C04B 35/565 |
| | | 264/624 |
| 7,811,914 B1* | 10/2010 | Quick ............... H01L 21/02381 |
| | | 257/E21.333 |
| 7,897,492 B2* | 3/2011 | Quick ............... H01L 21/02381 |
| | | 438/483 |
| 7,951,632 B1* | 5/2011 | Quick ....................... G01J 5/08 |
| | | 257/E21.065 |
| 8,067,303 B1 | 11/2011 | Quick et al. |
| 8,080,836 B2 | 12/2011 | Quick et al. |
| 8,114,693 B1 | 2/2012 | Quick et al. |
| 8,393,289 B2 | 3/2013 | Quick et al. |
| 8,617,669 B1 | 12/2013 | Quick et al. |
| 8,617,965 B1* | 12/2013 | Quick ............... H01L 21/02381 |
| | | 438/478 |
| 8,674,373 B2 | 3/2014 | Quick et al. |
| 8,722,451 B2 | 5/2014 | Quick et al. |
| 8,772,061 B2 | 7/2014 | Quick et al. |
| 8,828,769 B2 | 9/2014 | Quick et al. |
| 8,912,549 B2 | 12/2014 | Quick et al. |
| 9,059,079 B1 | 6/2015 | Quick et al. |
| 9,064,798 B2 | 6/2015 | Quick et al. |
| 9,211,609 B2 | 12/2015 | Salama et al. |
| 9,343,310 B1 | 5/2016 | Quick et al. |
| 2007/0281497 A1* | 12/2007 | Liu ..................... H01L 21/3105 |
| | | 438/781 |
| 2011/0266568 A1* | 11/2011 | Aldaz .................. H01L 33/145 |
| | | 257/98 |

OTHER PUBLICATIONS

Nathaniel R. Quick, Direct Conversion of Conductors on Ceramic Substrates, International Society for Hybrid Microelectronics, ISHM 90 Proceedings 1990.

Nathaniel R. Quick and Jeffrey A, Phillips, Latter Processes for Integrating Substrate Fabrication. Proceedings of the International Conference on Lasers '91, the Society for Optical & Quantum Electronics, pp. 537-544 San Diego, CA Dec. Sep. 13, 1991.

Nathaniel R. Quick and Richard J. Matson. Characterization of a Ceramic Electrical Conductor Synthesized by a Laser Conversion Process, Proceedings of the International Conference on Lasers '91, The Society for Optical & Quantum Electronics, pp. 545-552 San Diego, CA Dec. 9-13, 1991.

Nathaniel R. Mack, Characteritatioe of a Ceramic Sensor Synthesized by e Laser Conversion Process, Proceedings of the International Conference on Lasers '92. The Society for Optical & Quantum Electronics, pp. 881-887 Houston, Texas Dec. 7-10, 1992.

(56) References Cited

OTHER PUBLICATIONS

Nathaniel R. Quick, Charatterizatien of a Ceramic Thermal Sensor Synthesized by a Laser Conversion Process. ICALEO '92 (International Congress on Applications of Lasers and Electro-Optits). vol. 75 Laser Materials Promising, Laser Institute of America, pp. 394-404 Oct. 25-29, 1992.
D. K. Sengupta, N. R. Quick and A. Kar, Laser Direct Write of Conducting and Insulating Tracks in Wean Carbide, Materials Research Society Symposium Proceedings vol. 624 pp. 127-133 2000.
D. K. Sengupta, N. R. Quick and A. Kar, Laser Conversion of Electrical Properties for Silicon Carbide Device Applications, Journal of Laser Applications. 2001, vol. 13, pp. 26-31.
I.A. Salama, N.R. Quick and A. Kar, Laser Doping of Silicon Carbide Substrates, Journal of Electronic Materials, vol. 31, 2002, pp. 200-208.
I.A. Salama, N. R. Quick and A. Kar. Microstructural and electrical resistance analysis of laser-processed SiC substrates for wide bandgap semiconductor materials, Journal of Materials Science, vol. 40, 2005, pp. 3969-3980.
I.A. Salama, N. R. Quick and A. Kar, Laser Synthesis of Carbon-Rich SiC Nanoribbons, Journal of Applied Physics, vol. 93, 2003, pp. 9275-9281.
I.A. Salama, N. R. Quick, and A. Kar Laser Direct Write Doping of WideBandgap Semiconductor Materials, IEEE ISCS 2003 Proceedings.
A. Salama C. F. Middleton, N. R. Quick G. D. Boreman And A. Kar, Laser-Melalbed Saloon Carbide Schottky Diodes for Milimeter Wave Detection and Frequency Mixing, Sympsium N1 Nitride and Wide Bandgap Semiconductors for Sensors, Photonics and Eleetronics IV, 204th Meeting of the Electrochemical Society, Orlando, Florida Oct. 12-18, 2003.
A. Salama, N. R. Quick and A. Kar, Laser Direct Metallization of Silicon Carbide without Metal Deposition, Symposium C, New Applications for Wide Bandgap Semiconductors. Materials Research Society. Apr. 23-24 2003.
I. A. Salama, N. R. Quick and A. Kar, Laser-induced Dopant Incorporation in wide Bandgap Materials: Sic and GaN, ICALEO 2003 (International Congress on Appications of Lasers and Electro-Optics) Proceedings, 2003.
La. Salama, N. R. Quick, and A. Kar, Laser Direct Writing and Doping of Diamond-like Carbon, Polycrystalline Diamond and Single Crystal Silicon Carbide, Journal of Laser Applications, vol. 16, 2004, pp. 92-99.
Z. Tian, N. R. Quick and A. Kar, Laser Direct Write and Gas immersion Laser Doping Fabrication of Sic Diodes, J: Silicon Carbide Materials, Proposing and Devices, Symposium J Apr. 14-15, 2004.
Z. Tian, N. R. Quick and A. KAr, Laser Doping of Silicon Carbon and PIN Diode Fabrication, 23rd international Congress on Applications of Lasers & Electro-Optics 2004.
A. Kar and N. R. Quick, Laser Processing for Wide Bandgap Semiconductor Device Fabrication, 2004 Meeting of Optical Society of America, 2004.
Z. Tian, I.A. Salama, N. R. Quick and A. Kar, Effects of Different laser Sources and Doping Methods used to Dope Silicon Carbide. Acta Materlalia, vol. 63, 2005, pp. 2835-2844.
I.A. Salama, N. R. Quick and A. Kar, Microstructural and electrical resistance analysis of laser-processed SiC substrates for wide bandgap semiconductor materials, Journal of Materials Science, vol. 40, 2005, pp. 3969-3980.
Z. Tian, N. R. Quick and A. Kar: Characteristics of 8H-Silicon Carbide PIN Diodes Prototyping by Laser Doping, Journal of Electronic Materials, vol. 34, 2005. pp. 430-438.
Chong Zhang, A. Salama, N. R. Quick and A. Kar, Two-Dimensional Transient Modeling of CO2 Laser Drilling of Microvies in High Density Flip Chip Substrates, ICALEO 2005(International Congress On Applications of Lasers and Electro-Optics). Laser Institute of America, Oct. 31- Nov. 3, 2005.

Chong Zhang, S. Bet, A. Salama, N. R. Clack and A. Kar, CO2 Laser Drilling of Microvlas Using Diffractive Optics Techniques: I Mathematical Modeling. InterPack 05, The ASME/Pacific Rim Technical Conference on Integration and Packaging of MEMS, NEMS and Electronic Systems, San Francisco, CA Jul. 17-22, 2005.
Z. Tian, N. R. Quick and A. Kar, Laser Synthesis of Optical Structures in Silicon Carbide, 207th Meeting of the Electrochemical Society Proceedings, May 15-20, 2005.
Z. Tian, N. R. Quick and A. Kar, Laser-enhanced diffusion of nitrogen and aluminum dopants in silicon carbide, Acta Materiallia, vol. 54, 2006, pp. 4273-4283.
Z. Tian, N. R. Quick and A. Kar,Laser Direct Write Doping and Metallization Fabrication of Silicon Carbide PIN Diodes, Materials Science Forum, vols. 527-529, 2006, pp. 823-826.
S. Dakshinamurthy, N. R. Quick and A. Kar, Sic-based Optical interferometry at high pressures and temperatures for pressure end chemical sensing, Journal of Applied Physics, vol. 99, 2006. pp. 094902-1-094902-8.
C. Zhang, A. Salama, N. R. Quick and A. Kar, Modelling of Microvia Drilling with a Nd:YAG Laser, Journal of Physics D: Applied Physics 39 (2006) 3910-3918.
Z. Tian, N. R. Quick and A. Kar, Laser Endotaxy and PIN Diode Fabrication of Silicon Carbide, 2006 Spring Meting of Materials Research Society, 2006.
Z. Tian, N, R. Quick and A. Kar, Characteristics of Leser-Fabricated Diodes on Endotaxial Silicon Carbide Substrates, ESCRM (European Conference on Silicon Carbide and Related Materials) Proceedings 2006.
S. Bet, N. R. Quick and A. Kar, Laser Doping of Chromium and Selenium in p-type 4H-Sic, ICSCRM 2007 Symposium,.
N. Quick, S. Bet and A. Kar, Laser Doping Fabrication of Energy Conversion Devices Materials Science and Technology 2007 Conference and Exhibition.
S. Bet, N. R. Quick and A. Kar, Effect of Laser Field and Thermal Stress on Diffusion in Laser Doping of SiC, Acta Materialla 55 (2007) 6816-6824.
S. Bet, N. R. Quick and A. Kar, Laser-Doping of Silicon Carbide for p-n. Junction 35 and LED Fabrication, Physica Status Solidi (A), vol. 204, No. 4, 2007, pp. 1147-1157.
S. Dakshinamurthv, N. R. Quick and A. Kar, Temperature-dependent Optical Properties of Silicon 36 Carbide for Wireless Temperature Sensors. Journal of PhysicsD: Applied Physics 40 (2007)353-360.
S. Dakshinamurthy, N. R. Quick and A. Kar, High temperature optical properties of silicon carbide for wireless thermal sensing, Journal of Physics D: Applied Physics, vol. 40, No. 2, 2007, pp. 353-380.
Chong Zhang, A. Salama, N. R. Quick and A. Kar. Determination of Thermophyalcal Properties 38 for Polymer Films using Conduction Analysis of Laser Heating, International Journal of Thermophysics, vol. 28, No. 3, Jun. 2007.
N. R. Quick, S. Bet and A. Kar, Laser Doping Fabrication of Energy Conversion Devices, Materials Science and Technology 2007 Conference and Exhibition, Sep. 19, 2007.
S. Bet, N. R. Quick end A. Kar, Laser Doping of Chromium in 6h-SiC for White Light Emitting Diodes, 40 Laser Institute of America, Journal of Laser Applications Vo. 20 No. 1 pp. 43-40 Feb. 2008.
Z. Tian, N. R. Quick and A. Kar, Laser Endotaxy in &icon Carbide and Pin Diode Fabrication, Laser Institute of America, Journal of Laser Applications, vol. 20 No. 2 pp. 106-115. May 2008.
I. Salama, N. Quick and A. Kar, Laser Direct Write Doping of Wide-Bandgap Semiconductor Materials, ISCS 2003 Proceedings, 2003.
I. Salama, N. Quick and A. Kar Laser Microprocessing of Wide Bandgap Materials, Proceedings of International Congress on Laser Advanced Materials Processing (LAMP 2002).
S. Bet, N. Quick and A. Kar, Laser Doping of Chromium and Selenium in P-Type 4H-SiC, Materials Science Forum vols. 600-603 (2009) pp. 627-630.

\* cited by examiner

ULTRA-HIGH PRESSURE DOPING OF MATERIALS

CROSS-REFERENCE TO RELATED APPLICATIONS

This application claims benefit of U.S. Patent Provisional application No. 61/948,006 filed Mar. 4, 2014 and claims benefit of U.S. Patent Provisional application No. 61/936,078 filed Feb. 5, 2014 and claims benefit of U.S. Patent Provisional application No. 61/914,364 filed Dec. 10, 2013. All subject matter set forth in provisional application Nos. 61/948,006 and 61/936,078 and 61/914,364 is hereby incorporated by reference into the present application as if fully set forth herein.

BACKGROUND OF THE INVENTION

1. Field of the Invention

This invention relates to semiconductors and more particularly to an apparatus and a method for providing a high concentration of dopant into a semiconductor material.

2. Description of the Related Art

Compact high voltage fast photoconductive semiconductor switches (PCSS) require wide-bandgap compound semiconductors, particularly silicon carbide, with a high concentration, deep doping of N-type dopant that contributes electrons to the conduction band. Silicon carbide under evaluation for these applications requires maximizing n-type dopant concentrations and depths not achieved by ion implantation.

The increase in dopant concentration and depth overcomes the major disadvantage of silicon carbide high-power, high-temperature photoconducting devices, namely, high trigger energies for linera-mode operation (Colt J., Hettler C., and Dickens J., "Design and Evaluation of a Compact Silicon Carbide Photoconductive Semiconductor Switch", IEEE: Transactions on Electron Devices, Vol. 58, No.2., February 2011, pp 508-511).

US Published application US20120082411A1 to Sullivan et al discloses a high voltage photo switch package module.

High pressure doping of wide bandgap (compound) semiconductor substrates such as wafers can not be conducted by ion implantation since ion implantation is a high vacuum process. For example, ion implantation of nitrogen in silicon carbide has achieved dopant depths on the order of only 100 nm, and creates surface degradation/non-stoichiometry.

The prior art includes (Aoki T., Hatanaka Y., Look, D. C., "ZnO Diode Fabricated by Excimer-Laser Doping" (2002) Applied Physics Letters, 76(22), 3257-3258) excimer laser doped oxygen and nitrogen into zinc oxide at a maximum pressure of 4 atmospheres (58.8 psi). The doped layer was estimated to be approximately 50 nm.

The present invention is an improvement to above prior art and are further developments of semiconductors and wide bandgap materials using thermal energy beams or laser beams by the instant inventor Nathaniel R. Quick PhD. Discussion of semiconductors and wide bandgap materials and the processing thereof using thermal energy beams or laser beams are set forth in the following U.S. Patents that are hereby incorporated by reference into the present application as if fully set forth herein: U.S. Pat. No. 5,145,741; U.S. Pat. No. 5,391,841; U.S. Pat. No. 5,793,042; U.S. Pat. No. 6,732,562; U.S. Pat. No. 5,837,607; U.S. Pat. No. 6,271,576; U.S. Pat. No. 6,025,609; U.S. Pat. No. 6,054,375; U.S. Pat. No. 6,670,693; U.S. Pat. No. 6,939,748; U.S. Pat. No. 6,930,009; U.S. Pat. No. 7,013,695; U.S. Pat. No. 7,237,422; U.S. Pat. No. 7,268,063; U.S. Pat. No. 7,419,887; U.S. Pat. No. 7,951,632; U.S. Pat. No. 7,811,914 and U.S. Pat. No. 7,897,492.

Therefore, it is an objective of this invention is to provide an apparatus and a method for providing a high concentration of dopant into a material.

Another objective of this invention is to provide an apparatus and a method for forming a material having a dopant solubility to maximum solubility greater than ($10^{20}$ atoms/cc nitrogen in SiC).

Another objective of this invention is to provide a material having a dopant solubility to maximum solubility greater than 1020 atoms/cc nitrogen in SiC.

Another objective of this invention is to provide a catalyst having high energy site.

Another objective of this invention is to provide an apparatus and a method for making a material having a high concentration of dopant through laser processing.

Another objective of this invention is to provide an apparatus and a method for making a material having a high concentration of dopant through a plasma arc lamp processing.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to a method for doping a material comprising the steps of providing a semiconductor material substrate. A dopant gas is applied to the semiconductor material substrate at a pressure of at least 500 psi. The semiconductor material substrate is irradiated with a thermal energy beam to inject dopant gas atoms into the semiconductor material substrate.

In a more specific example of the invention, the step of the step of providing a semiconductor material substrate includes providing a wide bandgap semiconductor material substrate including silicon carbide substrate. The step of applying a dopant gas includes applying nitrogen. The step of applying the dopant gas to the wide bandgap semiconductor material substrate includes positioning the wide bandgap semiconductor material substrate into a high pressure chamber.

Preferably, the step of irradiating the substrate with a thermal energy beam includes irradiating the wide bandgap semiconductor material substrate with 532 nm wavelength radiations. In one example, the step of irradiating the substrate with a thermal energy beam includes irradiating the wide bandgap semiconductor material substrate with a laser beam. The step of irradiating the substrate may include scanning a laser beam over only selected areas of the substrate. In the alternative, the step of irradiating the substrate with a thermal energy beam includes irradiating the wide bandgap semiconductor material substrate with a high density plasma arc lamp.

The invention is incorporated into a semiconductor comprising a wide bandgap semiconductor having a dopant concentration greater than $10^{20}$ atoms per cubic centimeter and the dopant depth greater than 1000 nanometers. Preferably, the wide bandgap semiconductor is SiC and the dopant is Nitrogen.

Furthermore, the invention is incorporated into a photo conductive semiconductor switch comprising a semi-insulating compound semiconductor substrate n-type doped to a concentration of $10^{20}$ atoms per cubic centimeter and a dopant depth greater than 1000 nanometers. [delete] Preferably, the n-type doped semi-insulating compound semiconductor substrate has a surface cone array and has surface of low electrical resistance.

In another embodiment of the process of the invention, the step of providing a wide bandgap semiconductor material substrate includes providing a gallium nitride substrate. A silane dopant gas is applied to the gallium nitride substrate to provide N-type gallium nitride. In the alternative, the step of providing a wide bandgap semiconductor material substrate includes providing a gallium nitride substrate. A Bis-magnesium dihydrate vapor dopant gas is applied to the gallium nitride substrate to provide P-type gallium nitride.

In still another embodiment of the invention, the invention is incorporated into the method for doping a semiconductor material comprising the steps of providing a semiconductor material substrate and applying a dopant gas to the semiconductor material substrate at a pressure of at least 500 psi. The semiconductor material substrate is irradiated with a thermal energy beam to inject dopant gas atoms into the semiconductor material substrate. The method includes providing a silicon substrate and applying a gas containing carbon to the silicon to transform a region of silicon to silicon carbide.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characters refer to similar parts throughout the several Figures of the drawings.

DETAILED DISCUSSION

Figure 1:
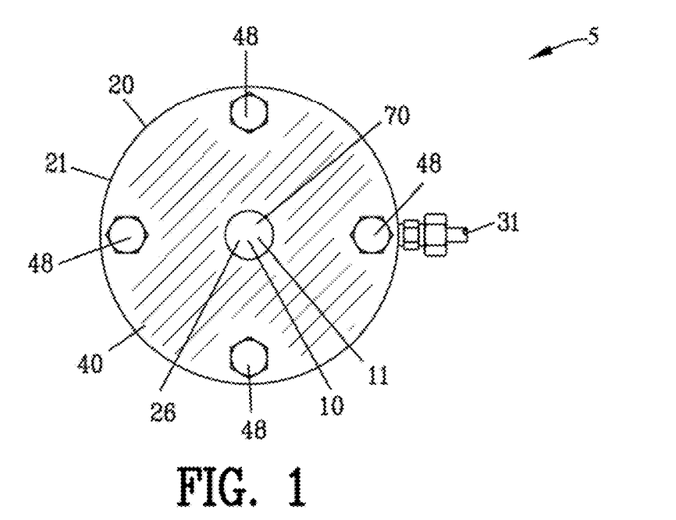
FIG. 1 is a top view of a first apparatus for doping a semiconductor substrate in accordance with the present invention.

FIG. 1 is a side view of an apparatus 5 for forming a doped semiconductor substrate 10 in accordance with the present invention. The substrate 10 defines a first and a second side 11 and 12 and a peripheral edge 13. Preferably, the substrate 10 is a wide bandgap semiconductor substrate. In this example, the substrate 10 is a silicon carbide (SiC) semiconductor substrate.

Figure 2:
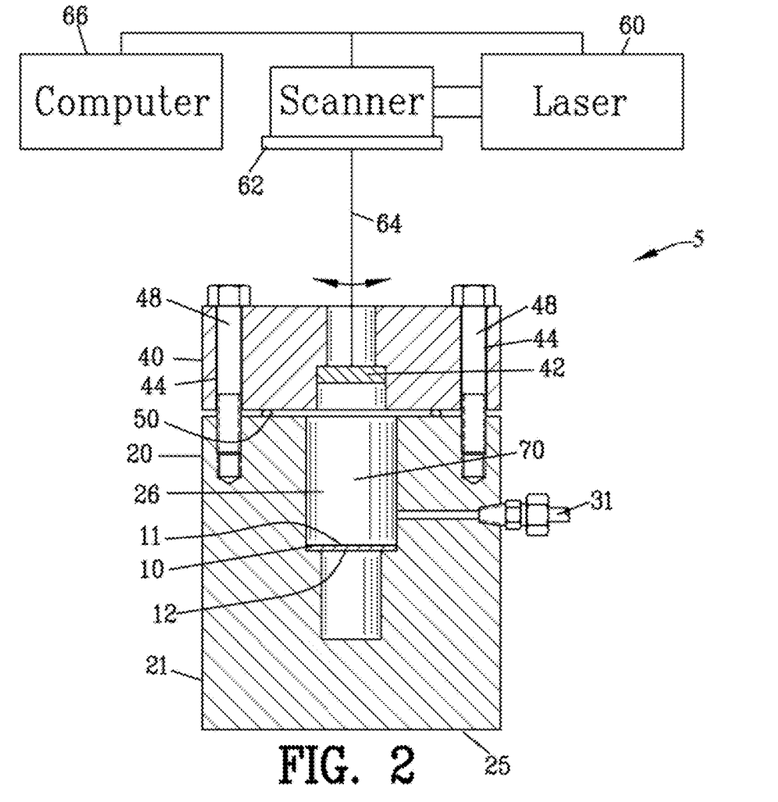
FIG. 2 is a side sectional view along line 2-2 in FIG. 1.

The substrate 10 is shown located in an air-tight chamber 20. The air-tight chamber 20 comprises a side wall 21 interconnected by a bottom wall 25 defining an interior space 26. A port 31 is located in the side wall 21 of the chamber 20 for injecting and removing gases into and out of the chamber 20.

A closure 40 is adapted to mate with the chamber 20 to form an airtight seal. The closure 40 includes a light transmitting window 42. The closure 40 includes plural apertures 44 for receiving the plural studs 38 extending from the chamber 20. Fastening nuts 46 secure the closure 42 the chamber 20.

A seal 50 is disposed between the chamber 20 and the closure 40. Preferably, the seal 50 is formed of a resilient material such as fluoropolymer elastomer or the like. The seal 50 enables the substrate 10 to be processing in a selected atmosphere.

A laser 60 is directed into a scanner 62 for creating a focused laser beam 64 to pass through the light transmitting window 42 and to impinge upon the first side 11 of the substrate 10. The scanner 62 enables the focused laser beam 64 to be positioned at various locations on the first side of the substrate 10. Preferably, the laser 60 and the scanner 62 are controlled by a computer 66.

A doping gas 70 is applied to the first side 11 substrate 10. In this example, a Nitrogen gas 72 is applied to the first side 11 of the substrate 10 under an ultra high pressure of 500 pound per square inch or greater.

The laser beam 64 is focused onto the first side 11 of the substrate 10 to inject atoms from the doping gas into the substrate 10. The laser beam 64 is focused onto the first side 11 of the substrate 10 to processes selected areas of the substrate 10 within the chamber 20. In the alternative, the laser beam 64 injects atoms from the doping gas into the entirety of the substrate 10. The laser beam 64 is focused onto the top surface region or through the substrate to the top surface region within the chamber 20.

Figure 3:
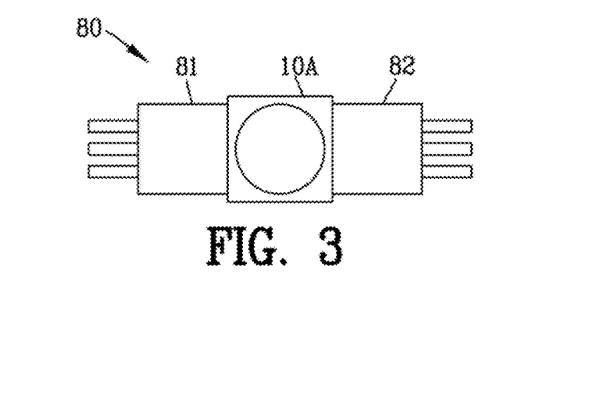
FIG. 3 is an isometric view of a photo conductive semiconductor switch fabricated in accordance with the process of the present invention.

FIG. 3 is a top view of photo conductive semiconductor switch 80 incorporating a doped semiconductor 10A in accordance with the present invention. The photo conductive semiconductor switch 80 comprises the photo-conductive substrate 10A bonded with two waveguides 81 and 82. An example of a photo conductive semiconductor switch is set forth in US patent publication US20120082411A1 to Sullivan which is incorporated by reference as if fully set forth herein. It should be understood that the photo conductive semiconductor switch 80 is merely one example of various devices semiconductor devices that may incorporate a doped semiconductor 10 in accordance with the present invention.

Figure 4:
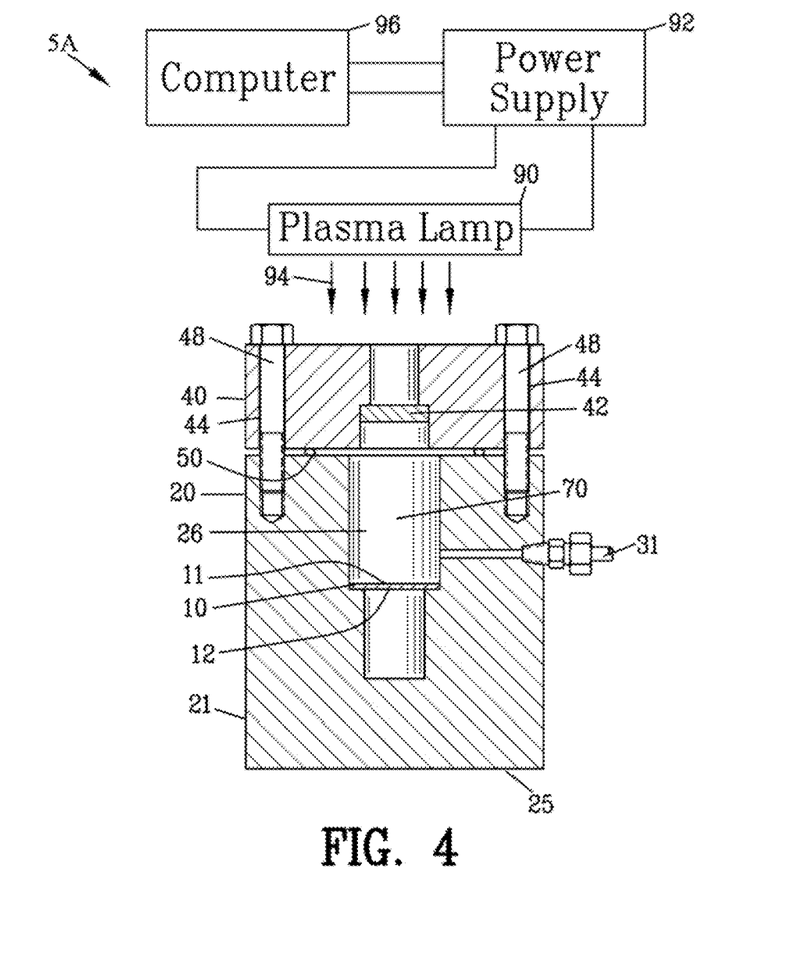
FIG. 4 is a side sectional view of a second apparatus for doping a semiconductor substrate in accordance with the present invention.

FIG. 4 is a side view of a second apparatus 6 for forming for forming a doped semiconductor 10 in accordance with the present invention. The chamber 20 is identical to the chamber shown in FIGS. 1 and 2. The apparatus 6 comprises a high density plasma arc lamp 90 for irradiating the substrate 10 within the chamber 20. The plasma lamp 90 is powered by a power supply 92 to provide a plasma beam 94. The plasma lamp 90 is controlled by a computer 96. The computer 96 controls the intensity, pulse duration and the pulse frequency of the plasma lamp 90. The electromagnetic radiation emanating from the plasma lamp 90 is transmitted through the light transmitting top window 42 of the closure 40 to irradiate the substrate 10 in accordance with a computer program stored in the computer.

A suitable plasma lamp 90 is described in U.S. Pat. No. 4,937,490 and U.S. Pat. No. 7,220,936 that are incorporated by reference into the present specification as if fully set forth herein. The plasma lamp 90 can supply large power densities, (up to 20,000 Watts/square centimeter) over large areas (4 square meters) in short time frames (0.5 microseconds to 10.0 seconds).

The plasma lamp 90 is capable of quickly delivering large amounts of heat over large surface areas with little or no deleterious influence upon subsurface compositions. The computer 96 controls the pulse energy from the plasma lamp 90 in both duration and/or periodicity to allow precise control various process parameters. In the process of the present invention, the plasma lamp 90 with a dominate wavelength emission near 532 nm, is used for processing large areas or the entirety of the substrate 10.

The electromagnetic radiation emanating from the plasma lamp 90 is transmitted through the light transmitting top window 42 of the chamber 20 to irradiate the substrate 10 in accordance with a computer program stored in the computer. The interior space 26 of the chamber 20 is filled with a high pressure doping gas 90. The high pressure doping gas 90 is applied to the first side 11 substrate 10. In this example, a Nitrogen gas 70 is applied to the first side 11 of the substrate 10 under an ultra high pressure of 500 pound per square inch or greater.

The apparatus 5 of FIGS. 1 and 2 is best suited for forming a doped semiconductor 10 in selected areas of the semiconductor substrate whereas the second apparatus 6 is best suited for forming a doped semiconductor 10 over the total surface area of the semiconductor substrate.

The high doping gas pressure (nitrogen) reduces and eliminates sublimation and/or degradation of the silicon carbide surface. The high doping gas pressure (nitrogen) increases the solubility of nitrogen in silicon carbide. Sievert's Law states that solubility increase directly with the square root of gas pressure. (Sievert's Law applies to diatomic gases such as nitrogen which dissociate to atoms before diffusing into a metal or semiconductor). This is important for highly defect free silicon carbide which has limited defects (dislocations, voids, micropipes) to assist in gas entry into the substrate.

The maximum solubility of nitrogen in silicon carbide has been reported to be $6 \times 10^{20}$ atoms/cc (Ref. G. L. Harris, Published by INSPEC, the Institution of Electrical Engineers, London, United Kingdom, 1995, pg 153-155.)

EXAMPLE I

Laser nitrogen doping of a semi-insulating 4H-SiC containing approximately $1 \times 10^{17}$ to $2 \times 10^{17}$ atoms/cc vanadium (10 mm × 56 mm × 1000 micron substrate)
Process Parameters

| Laser Source: | 532 nm wavelength |
|---|---|
| Power: | 55 watts |
| Frequency: | 10 KHz |
| Duration: | 8 microsec |
| Beam diameter: | 100 micron |
| Scan rate: | 2 mm/s |
| Scan number: | 100 |
| Gas: | UHP Nitrogen |
| Gas pressure: | 520 psi |

Characterization and Analysis
(Held Emission SEM (FESEM)/Energy Dispersive X-ray (EDX))

The doped nitrogen concentration was measure directly by refining a Field Emission SEM (scanning electron microscope)/EDX(energy dispersive x-ray) technique to evaluate the semi-insulating (vanadium-doped) samples. The depth of the electron beam interaction volume was about 1-2 micron. The samples require no electrically conductive coating.

| Microscope: | FESEMIEDX (Zeiss Ultra 55, Gemini) |
|---|---|
| Acceleration Voltage: | 5.0 KV |
| Beam interaction depth: | 1-2 micron |

Chemical Analysis

Figure 5:
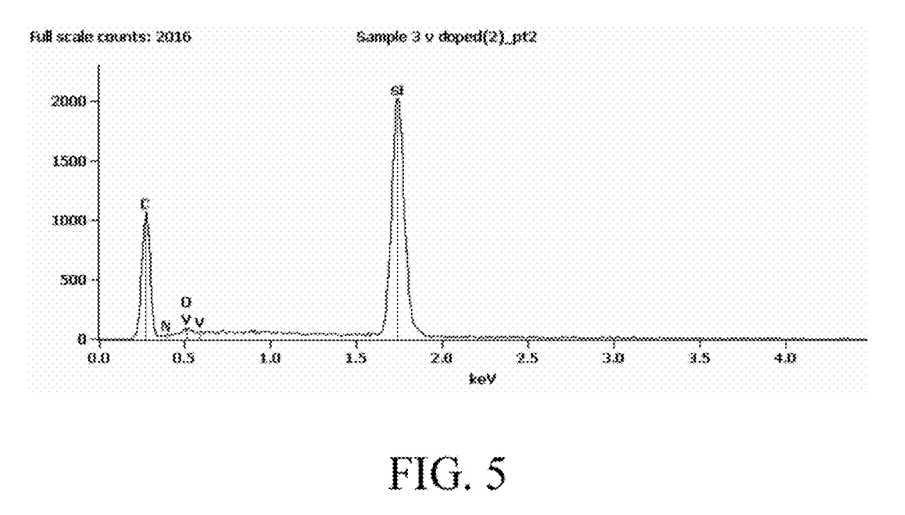
FIG. 5 is an energy dispersive X-ray spectrum of X-ray photon count verses the energy level of the energy in X-ray photon count for an SiC substrate ureated by the present invention.

FIG. 5 is an energy dispersive X-ray spectrum of X-ray photon count verses the energy level of the energy in X-ray photon count for a SiC substrate doped in accordance with the method of the prior art. The baseline detection for nitrogen in an untreated surface area of the semi-insulating SiC is 1.71 atom %. This number is taken as the baseline for nitrogen detection.

Figure 6:
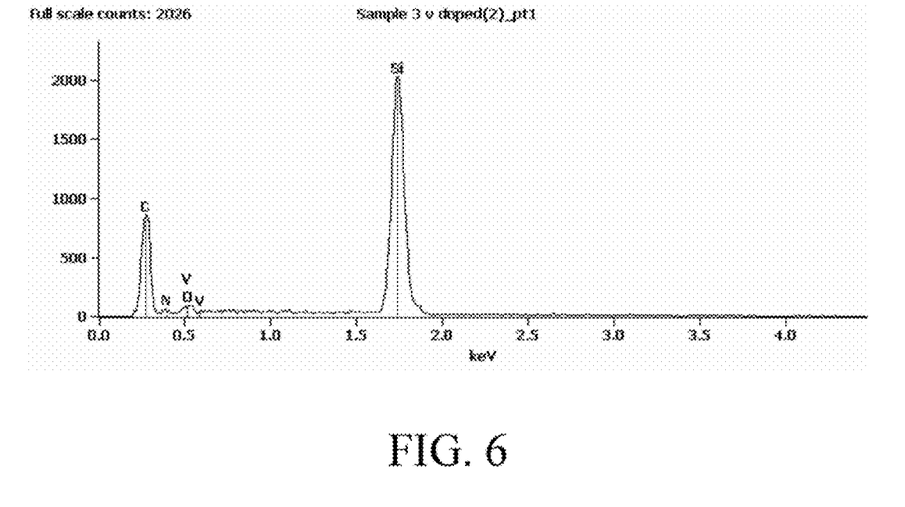
FIG. 6 is an energy dispersive X-ray spectrum of X-ray photon count verses the energy level of the energy in X-ray photon count for a SiC substrate doped in accordance with the method of the present invention.

FIG. 6 is an energy dispersive X-ray spectrum of X-ray photon count verses the energy level of the energy in X-ray photon count for a SiC substrate doped in accordance with the method of the present invention. The a SiC substrate doped in accordance with the method of the present invention exhibits an increased nitrogen peak at approximately 0.0.4 keV.

Exposure to 100 scans shows a nitrogen concentration of 4.01 atom %; a neighboring area showing no topological change shows a nitrogen concentration of 1.55 atom % comparable to the 1.71 atom % baseline. Therefore, the laser treated area shows a nitrogen concentration, c[N]~1 to 2 atom % given the baseline and error. This is equivalent to $4.8 \times 10^{20}$ to $9.6 \times 10^{20}$ atoms/cc. Nitrogen has been incorporated by laser doping into the semi SiC substrate.

Structural

Figure 7:
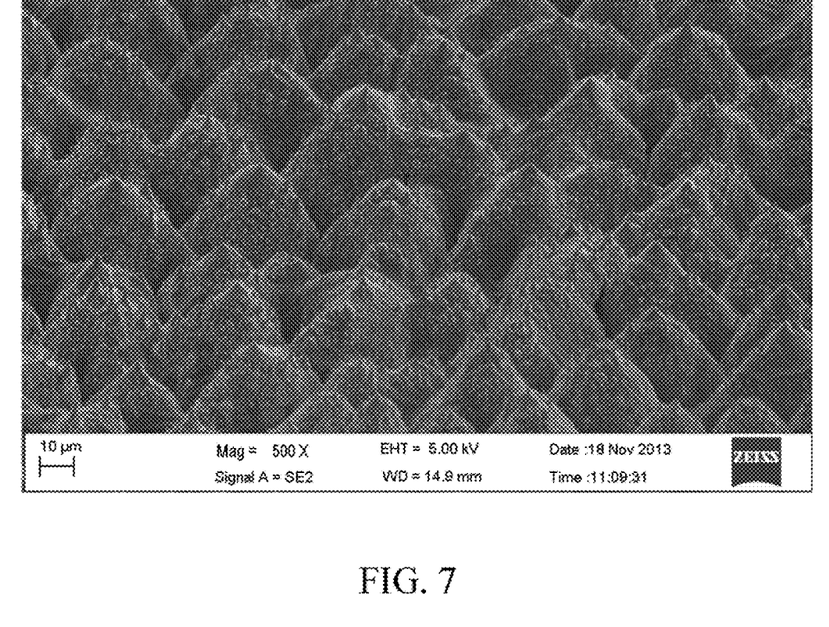
FIG. 7 is a scanning electron microscope micrograph (SCM) of a SiC substrate doped in accordance with the method of the present invention.

FIG. 7 is an angled scanning electron microscope (SCM) micrograph view of a SiC substrate doped in accordance with the method of the present invention. The micrograph was taken at a tilt angle of 59 degrees. The micrograph shows an array of cone like structures across the surface where a surface change is observed. The base of each cone is about 10-20 micron with a height of 10-20 microns. The surface structure increases the effective surface area of the SiC substrate. The increased surface area is beneficial in photon trapping and hence energy absorption. The doped surface area, the majority of the micrograph, has a greater effective surface area relative to the non-doped surface area illustrated by the flat area in the upper right hand corner of the micrograph.

A more sparse cone array structure was observed; some. Note that some features of the structure was formed for all scan numbers; it contrast and continuity of these features decreased with decreasing scan number.

The chemical measurement sensitivity of the FESEM/EDX shows no change in carbon concentration of this surface transition. The surface transition features are associated with morphological changes including crystal structure.

This structure observed on a companion substrate exhibiting the same morphological change showed a resistance of approximately 48 ohms measured by 2 point probe. The as received substrate showed no measurable conductivity on an HP ohmmeter greater than the maximum Mohm scale (e.g., >100 Mohms) on an HP ohmmeter. The sister substrate was used for electrical property measurement to prevent metal transfer from the probe tips and hence contamination for EDX examination.

EXAMPLE II

Laser Nitrogen Doping of N-type 4H-SiC Containing $10^{15}$ to $10^{16}$ Atoms/cc Nitrogen (10 mm×10 mm×300 Micron Substrate)

For comparison an n-type doped 4H-SiC sample was laser doped at scans using process parameters identical to those for the semi-insulating substrate.

Chemical Analysis

As received n-type SiC, provided by Dow Corning, is reported to have a nitrogen concentration of $10^{15}$ to $10^{16}$ atoms/cc. These levels where not detectable by our FESEM/EDX procedure.

Exposure to 100 scans shows a nitrogen concentration of 3.01 atom %; while a neighboring area showing no topological change shows a nitrogen concentration of 1.55 atom % comparable to the baseline 1.28 atom %. Therefore, the laser treated area shows a nitrogen concentration, c[N] ~0.5-1 atom % given the measurement error. Additional nitrogen has been incorporated by laser doping into the N-type SiC substrate. Lower scan numbers showed no detectable nitrogen incorporation.

Structural

Figure 8:
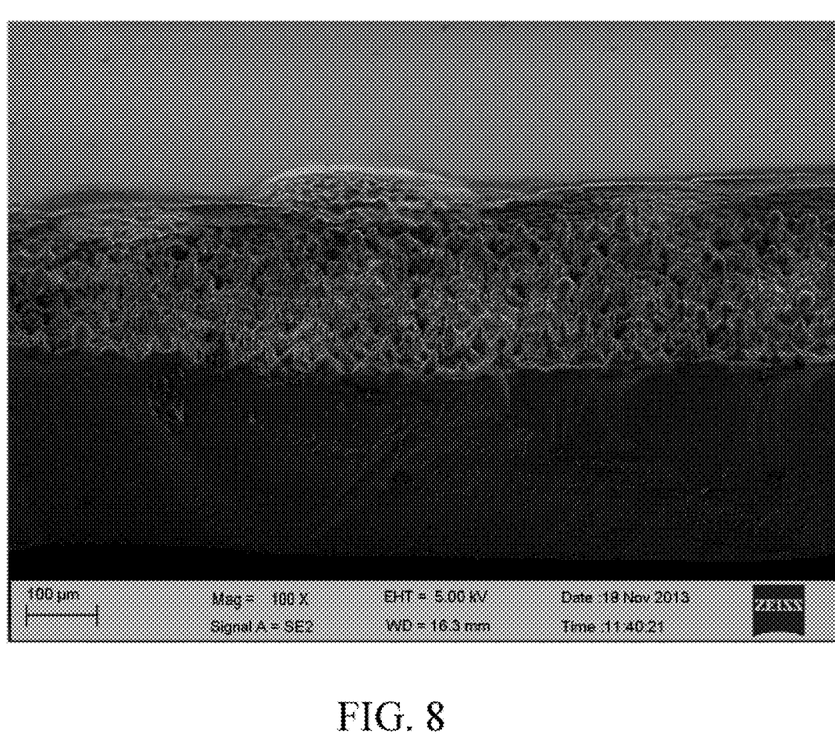
FIG. 8 is an angled scanning electron microscope micrograph (SCM) view of a SiC substrate doped in accordance with the method of the present invention.

FIG. 8 shows a cross section through the n-type SiC laser nitrogen doped 100 scans. A more sparse cone array structure was observed than for example I; some cones exhibited a droplet formation at the top. The cones have a height 10-30 micron; a band below the cones has a thickness of about 1 micron. This region apparently has mechanical properties different from the remainder of the bulk and is considered the maximum depth of the laser-materials interaction. Therefore the thickness (average cone height plus region above the bulk) of the laser treated area is approximated at 20 microns.

This structure observed on a companion substrate exhibiting the same morphological change showed a resistance of approximately 10 ohms measured by 2 point probe. The as received substrate showed a resistance of about 20 Mohm on an HP ohmmeter.

EXAMPLE III

High Pessure Laser Doping of Gallium Nitride

Contact resistance and access resistance in deeply scaled FET devices greatly impact device performance at high frequency. This is of particular importance for GaN-based devices, which can achieve high power at high frequencies (>100 GHz). Several processes have been developed to address these resistance issues, but these processes all have drawbacks. For example, ion implantation can be used to increase the concentration of electrically active impurities in the source and drain regions of the device, but this process requires high temperatures for electrical activation, along with capping layers to prevent GaN decomposition. Additionally, implantation creates lattice damage that is difficult to remove via annealing and acts to compensate the dopants.

To improve GaN device performance for high-frequency RF applications, the high pressure (greater than 500 psi gas/vapor precursor) laser doping process is an improvement used to introduce electrically active n-type impurities into the source and drain regions of a GaN device to reduce contact resistance and decrease access resistance from the metal contact to the two dimensional electron gas (2DEG) in the device. Silicon (Si) is the impurity chosen for n-type doping using a silane precursor. The preferred laser source is 532 nm wavelength.

To improve p-type doping, high pressure laser doping is used to inject magnesium (Mg) atoms into the GaN substrate using a Bis-magnesium dihydrate vapor precursor. This is an improvement over our low pressure doping process where the vapor pressure does not exceed 15 psi. Preferred irradiation is with a 532 nm wavelength laser.

The high pressure laser doping process is a combination of a thermally driven process resulting from the interaction of the semiconductor with a high-power, short-duration laser pulse and a pressure driven process to increase dopant concentration to maximum solubility levels at deep depths while mitigating surface damage. The laser pulse results in an ultra-fast thermal ramp ($10^{10}$ K/s) and impurity incorporation through decomposition of chemisorbed gas-phase source species and thermal diffusion of atoms into the crystalline lattice. Impurity incorporation rate, diffusivity, and activation are all functions of the laser wavelength, power, and pulse time and precursor pressure. A laser system and processing chamber has been built for high pressure laser doping for rapid processing of substrates and simplification of the device fabrication process.

EXAMPLE IV

High Pessure Carbon Laser Doping of Gallium Nitride for Power Electronics

Silicon and carbon are amphoteric dopants that behave as a p-type dopant or n-type dopant depending on which lattice vacancy site they occupy. Select vacancy sites are created by effusion of gallium or nitrogen atoms. Precursors, including methane and acetylene are preferred carbon precursors. Silane is a suitable precursor for silicon. Precursors are subjected to high pressures, greater than 500 psi, for laser doping of either carbon or silicon into GaN.

EXAMPLE V

High Pressure Doping of Carbon Doping of Silicon Wafers

The invention is expanded to carbon doping of silicon wafers (see U.S. Pat. Nos. 7,811,914 and 8,617,965) to create a surface region of silicon carbide in silicon to accommodate GaN thin film deposition.

Representative semiconductor materials include wide bandgap semiconductor such as SiC, AlN, ZnO, BN, DLC (diamond-like-carbon), GaN, silicon carbide regions in silicon and Tungsten Oxide. The process disclosed in the invention applies to substantially all indirect bandgap semiconductors including silicon, silicon carbide, boron nitride, aluminum nitride, diamond, DLC, and gallium phosphide. The process is applicable to direct bandgap semiconductors (GaN, ZnO) and their dopants. The dopants for solid state devices include Al, Se, Cr, V, N, Mg, Si, Ga, As, P and Sb from gaseous, metalorganic or solid (thin film, powder etc) precursors.

EXAMPLE V

High Pressure Laser Surface Modification and Enhanced Activity of Catalytically Active Semiconductors Reaction sites on catalysts are usually areas of specific characteristics such as ability to bind reactants. These areas are also regions that cause strains on chemical bonds due to physical and electrostatic interactions with the reaction precursors. It is often found that the sites most reactive are those of the highest surface energy compared to the bulk of the material. Thus areas of defects such as kinks and dislocations in the catalyst crystal structure prove to be very reactive and sometimes reaction specific. In metals these areas can be created by cold working exhibiting increased chemical reactivity in the form of corrosion rate. Another way to create these higher energy sites is to quench a high temperature structure and essentially freeze the high energy state. With semiconductor catalysts such as silicon carbide high energy state freezing can be accomplished by laser treatment. Surface temperatures in excess of 3000° F. can be achieved with rapid cooling not attainable by other heat treatment methods. For example, treatment of semi-insulating 4H-SiC in high pressure nitrogen (greater than 500 psi) with a 532 nm wavelength beam and 700 MW/cm2 irradiance resulted in the surfaces shown in FIGS. 7 and 8.

As can be seen in the image the surface consists of cones and valleys. This is a direct result of freezing of the molten SiC once the beam has passed. With most reported methods of laser treatment of SiC if the surface temperature is allowed to go above 2500° F. the Si vaporizes as is evident by the visible plume in the beam. With laser processing in high pressure the vapor pressure of the Si is suppressed by the increased chamber pressure thus eliminating Si vaporization. This results in sustaining original stoichiometry in the frozen high energy surface structure, With current efforts for use of SiC in the areas of electrophotocatalytic reduction of CO2 and as a support for PEM fuel cell catalysts it is believed that the high energy structures of high pressure laser treated material could prove beneficial. The higher energy of the treated material along with its increased surface area should result in higher turnover of reactants not only for its direct use as a catalyst but also as a support due to its higher energy interaction with active species.

It is believed that the use of high pressure doping as set forth above will increase the efficiency and the process and the end product set forth in my previous inventions including U.S. Pat. No. 5,145,741; U.S. Pat. No. 5,391,841; U.S. Pat. No. 5,793,042; U.S. Pat. No. 6,025,609; U.S. Pat. No. 6,732,562; U.S. Pat. No. 5,837,607; U.S. Pat. No. 6,271,576; U.S. Pat. No. 6,025,609; U.S. Pat. No. 6,054,375; U.S. Pat. No. 6,670,693; U.S. Pat. No. 6,939,748; U.S. Pat. No. 6,930,009; U.S. Pat. No. 7,013,695; U.S. Pat. No. 7,237,422; U.S. Pat. No. 7,268,063; U.S. Pat. No. 7,419,887; U.S. Pat. No. 7,951,632; U.S. Pat. No. 7,811,914; U.S. Pat. No. 7,897,492 and U.S. Pat. No. 8,080,836.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method for doping a gallium nitride substrate, comprising the steps of:
   providing a gallium nitride substrate;
   applying a silane dopant gas precursor at a pressure of at least 500 psi to provide a silicon dopant to the gallium nitride substrate; and
   irradiating the gallium nitride substrate with a thermal energy beam to inject dopant gas atoms into the gallium nitride substrate for forming N-type gallium nitride.

2. A method for doping a gallium nitride substrate, comprising the steps of:
   providing a gallium nitride substrate;
   applying a Bis-magnesium dihydrate vapor dopant gas to the gallium nitride substrate at a pressure of at least 500 psi; and
   irradiating the gallium nitride substrate with a thermal energy beam to inject magnesium dopant gas atoms into the gallium nitride substrate for forming P-type gallium nitride.

3. A method for doping a gallium nitride substrate, comprising the steps of:
   providing a gallium nitride substrate;
   applying an amphoteric dopant gas or vapor precursor to the gallium nitride substrate at a pressure of at least 500 psi, and
   irradiating the gallium nitride semiconductor material substrate with a thermal energy beam to inject amphoteric dopant gas atoms into the gallium nitride substrate to provide either an N-type or P-type gallium nitride.

4. A method of doping a gallium nitride substrate as set forth in claim 3, wherein the amphoteric dopant atoms are selected form the group silicon and carbon.

5. A method of doping a gallium nitride substrate as set forth in claim 3, wherein the dopant precursor is selected from the group of silane, methane and acetylene.

6. A method for doping a gallium nitride substrate as set forth in claim 3, wherein the step of applying the dopant gas to the wide bandgap material substrate includes positioning the gallium nitride substrate into a high pressure chamber.

7. A method for doping a gallium nitride substrate as set forth in claim 3, wherein the step of irradiating the substrate with a thermal energy beam includes irradiating the gallium nitride substrate with 532 nm wavelength radiation.

8. A method for doping a gallium nitride substrate as set forth in claim 3, wherein the step of irradiating the substrate with a thermal energy beam includes irradiating the gallium nitride substrate with a laser beam.

9. A method for doping a gallium nitride substrate as set forth in claim 3, wherein the step of irradiating the substrate with a thermal energy beam includes irradiating the gallium nitride substrate with a laser beam over only selected areas of the substrate.

10. A method for doping a gallium nitride substrate as set forth in claim 3, wherein the step of irradiating the substrate with a thermal energy beam includes irradiating the gallium nitride substrate with a high density plasma arc lamp emitting a dominate wavelength of 532 nm.

11. A method for doping a gallium nitride substrate comprising the steps of:
providing a gallium nitride substrate;
creating select vacancy sites by effusion of gallium or nitrogen;
applying an amphoteric dopant gas or vapor precursor to the gallium nitride substrate at a pressure of at least 500 psi;
irradiating the gallium nitride semiconductor material substrate with a thermal energy beam to inject amphoteric dopant gas atoms into the gallium nitride substrate to provide either an N-type or P-type gallium nitride.

12. A method of doping a gallium nitride substrate as set forth in claim 11, wherein the amphoteric dopant atoms are selected from the group silicon and carbon.

13. A method of doping a gallium nitride substrate as set forth in claim 11, wherein the dopant precursor is selected from the group of silane, methane and acetylene.

14. A method for doping a gallium nitride substrate as set forth in claim 11, wherein the step of applying the dopant gas to the wide bandgap material substrate includes positioning the gallium nitride substrate into a high pressure chamber.

15. A method for doping a gallium nitride substrate as set forth in claim 11, wherein the step of irradiating the substrate with a thermal energy beam includes irradiating the gallium nitride substrate with 532 nm wavelength radiation.

16. A method for doping a gallium nitride substrate as set forth in claim 11, wherein the step of irradiating the substrate with a thermal energy beam includes irradiating the gallium nitride substrate with a laser beam.

17. A method for doping a gallium nitride substrate as set forth in claim 11, wherein the step of irradiating the substrate with a thermal energy beam includes irradiating the gallium nitride substrate with a laser beam over only selected areas of the substrate.

18. A method for doping a gallium nitride substrate as set forth in claim 11, wherein the step of irradiating the substrate with a thermal energy beam includes irradiating the gallium nitride substrate with a high density plasma arc lamp emitting a dominate wavelength of 532 nm.

19. A method for doping a wide bandgap material, comprising the steps of:
providing a wide bandgap material substrate;
choosing a dopant selected from the group consisting of Al, Se, Cr, V, N, Mg, Si, Ga, As, P, C and Sb;
applying the dopant to a surface of the wide bandgap material substrate as a precursor in the form of a gaseous, metalorganic, solid thin film or powder; and
irradiating the wide bandgap semiconductor material substrate with a thermal energy beam to inject dopant gas atoms into the wide bandgap material substrate.

20. A method for doping, increasing the effective surface area and eliminating surface degradation of a semi-insulating wide bandgap material having a resistivity greater than $10^9$ ohm-cm and a vanadium dopant concentration ($10^{17}$ atoms/cc) comprising the steps of:
providing a semi-insulating silicon carbide substrate ($10^9$ ohm-cm) and vanadium dopant concentration ($10^{17}$ atoms/cc);
applying an ultra high purity nitrogen dopant gas precursor to the silicon carbide substrate at a pressure of at least 500 psi, and
irradiating the semi-insulating semiconductor material substrate with a thermal energy beam to inject nitrogen dopant gas atoms into the silicon carbide substrate to provide N-type silicon carbide with a cone-array surface with each of the cones having a micron dimension or less.

21. A method for doping a wide bandgap material as set forth in claim 20, wherein the dopant solubility is increased resulting in a dopant concentration greater than $4.8 \times 10^{20}$ atoms per cubic centimeter at a depth greater than 1 micron.

* * * * *